United States Patent [19]
Ambrose

[11] Patent Number: 5,061,830
[45] Date of Patent: Oct. 29, 1991

[54] EXTENSION ELECTRICAL SWITCH SYSTEM AND METHOD OF MANUFACTURE

[76] Inventor: Stephen D. Ambrose, Ste. 176, 33338 Agua Dulce Canyon Rd., Agua Dulce, Calif. 91350

[21] Appl. No.: 510,196

[22] Filed: Apr. 16, 1990

[51] Int. Cl.[5] ............... H01H 13/70; H05K 1/00; H01R 9/07
[52] U.S. Cl. ............................. 200/5 A; 361/398
[58] Field of Search ............ 200/1 R, 5 R, 5 A, 16 A, 200/16 R, 83 N, 86 R, 292, 512–517; 361/380, 397, 398, 399, 400, 401

[56] References Cited

U.S. PATENT DOCUMENTS

| | | | |
|---|---|---|---|
| 3,001,171 | 9/1961 | Schultz | 439/49 X |
| 3,383,487 | 5/1968 | Wiener | 200/5 A X |
| 3,408,612 | 10/1968 | Bute et al. | 439/68 |
| 3,544,950 | 12/1970 | Lopez et al. | 361/401 X |
| 3,723,673 | 3/1973 | Clary et al. | 200/5 A X |
| 3,745,288 | 7/1973 | Reimer | 200/16 A X |
| 3,772,775 | 11/1973 | Bonnke et al. | 439/493 X |
| 3,772,776 | 11/1973 | Weisenburger | 439/67 X |
| 3,860,771 | 1/1975 | Lynn et al. | 200/5 A |
| 3,862,381 | 1/1975 | Glaister et al. | 200/5 A |
| 3,862,382 | 1/1975 | Glaister et al. | 200/5 A |
| 3,873,889 | 3/1975 | Leyba | 361/398 X |
| 4,018,491 | 4/1977 | Niedzwiecke et al. | 439/68 X |
| 4,044,397 | 8/1977 | Moore | 439/65 X |
| 4,046,975 | 9/1977 | Seeger, Jr. | 200/5 A X |
| 4,066,851 | 1/1978 | White et al. | 200/86 R X |
| 4,096,577 | 6/1978 | Ferber et al. | 361/398 X |
| 4,180,711 | 12/1979 | Hirata et al. | 361/398 X |
| 4,349,712 | 9/1982 | Michalski | 200/5 A X |
| 4,425,484 | 1/1984 | Fukukura | 200/5 A |
| 4,474,420 | 10/1984 | Nestor | 439/498 |
| 4,609,241 | 9/1986 | Peterson | 439/85 X |
| 4,658,104 | 4/1987 | Koizumi et al. | 439/77 X |
| 4,733,590 | 3/1988 | Watanabe | 200/5 A X |
| 4,761,881 | 8/1988 | Bora et al. | 361/400 X |
| 4,767,943 | 8/1988 | Adler et al. | 200/5 A X |

OTHER PUBLICATIONS

*IBM Technical Disclosure Bulletin,* "Circuit Board Connective Scheme", Roche et al., vol. 16, No. 8, Jan. 1964, pp. 87, 88.
*IBM Technical Disclosure Bulletin,* "Printed Circuit Connector", Dunman, vol. 7, No. 3, Aug. 1964, p. 182.

*Primary Examiner*—J. R. Scott
*Attorney, Agent, or Firm*—L. Lee Humphries

[57] ABSTRACT

An electrical switch system, which is comprised of a relatively long electrical conductor or conductors disposed on a flexible resilient film having, at or near one end, an electrical connector or separable, electrical connectors, and at or near the other end, an electrical switch or switches. Also disclosed is the method of manufacture of such extension electrical switch system. The invention is particularly useful in providing switches at more convenient locations for manual operation, such as being able to control the output of a computer keyboard from a nearby, more convenient location, say, by the hand, when it is also operating a mouse as if a key on the keyboard had been depressed. The switches used are those commonly referred to as touch-type switches, membrane switches or film switches.

21 Claims, 8 Drawing Sheets

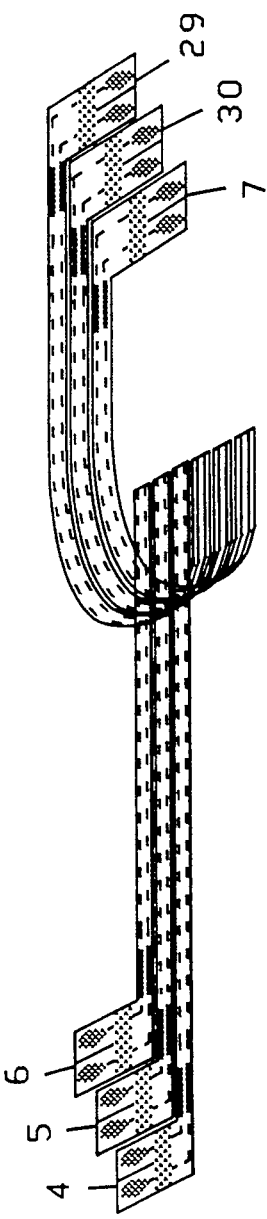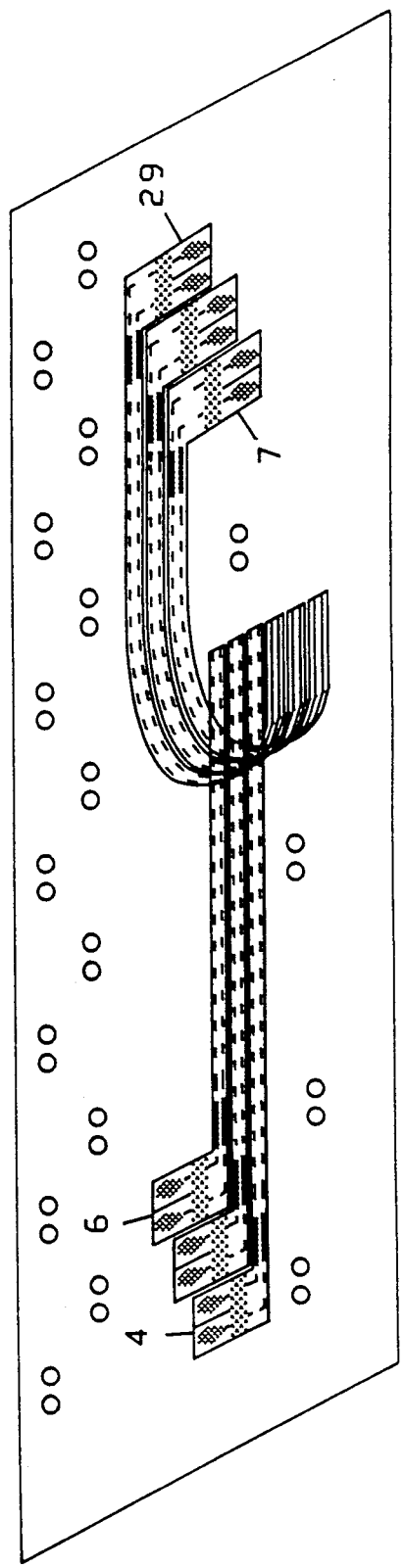

EXTENSION ELECTRICAL SWITCH SYSTEM AND METHOD OF MANUFACTURE

This invention is related to a patent application filed by me simultaneously herewith, entitled Method of Manufacturing an Electrical Circuit System and Electrical Circuit System, Ser. No. 07/510,465. That patent application relates to a method of manufacturing an electrical circuit system and the electrical circuit system connecting to in-line electronic packages and other electronic circuitry packages.

This invention relates to an extension electrical switch system comprised of a relatively long electrical conductor, or conductors, on a thin, flat film having at one end an electrical connector, or electrical connectors, for ready connection to electrical elements which may be active or passive elements, or simply electrodes or electrical leads and having at the other end of said conductor, an electrical switch, or switches. Said connector(s), conductor(s) and the electrodes of the switch(es) are, in a preferred embodiment, are all constructed on the same film, are constructed electrically integral, or in continuum, with each other and have a thickness of the same order of magnitude as each other. This invention also relates to a method of manufacture of said extension electrical switch system comprised of said conductors, connectors and switch electrodes on said film.

BACKGROUND OF THE INVENTION

Electrical conductors have previously been inked, or painted, on film substrates. Conductive ink or paint is readily available for painting, or printing of circuits and conductors on plastic films, which films are commonly known and commonly available for use as electrical substrates. The use of electrically-conductive paint in making electrical conductors is well-known to those skilled in the art. See, for example, U.S. Pat. No. 3,325,580, for Musical Instrument Utilizing Piezoelectric Transducer, issued June 13, 1967, to L. M. Barcus et al., Col. 6, line 11, et seq.

For information pertaining to conductive inks, conductive adhesive inks, adhesives and surface mount technology (SMT), in general, refer to Radio-Electronics, page 59 et seq., November, 1987, "Introduction to SMT", by Forrest M. Mims, III.

Most any form of graphical reproduction may be used in the process of the invention or manufacturing the device of the invention, to apply the conductive material (ink, paint, etc.) in the desired electrical pattern. Printed circuit board technology has long used photographic, photolithographic, etching and other techniques to create electrical conductors on fiberglass boards.

Conductive "ink" or "paint" are meant herein to be synonymous and each are intended herein to mean and include the other, as are "printing" and "painting", in this connection. Silk screening is also considered "inking" or "painting". So, too, "graphical reproduction" is intended to include "printing" and "painting" and all other methods of applying "ink" or "paint" to paper, plastic or other carrier. All such methods are included within the meaning of "graphical reproduction", whether it be by typography, photography, lithography, plotting, recording, offset printing, silk, plastic or stainless steel screening or otherwise. Any suitable methods of depositing or forming the conductive material in the desired Pattern may be used.

Touch-type switches, or film, or membrane, switches have been known for some time. One good example of touch switches in daily use are those in the switch panel of a microwave oven. Household washers and dryers commonly use such touch panel switches. The switches customarily provide a momentary electrical connection between two conductors which acts to complete an electrical path and trigger, electrically activate or deactivate, another electrical element. For example, a flip-flop circuit, relay or other bistable circuit may be caused to change state or to be "set" by such momentary trigger. The flip-flop then provides its output as input to some other electrical circuitry.

Electrical connectors come in many sizes, shapes and structures. It is difficult to connect a connector to a painted, evaporated or printed conductor by soldering, welding, wire wrap, fusion bonding or other standard means of electrical connection. The difficulty is compounded when there are multiple conductors and multiple layers of conductors. In making electrical connections, adhesive connectors are known to those skilled in the art. For example, the use of conductive epoxy in a conductive adhesive to connect electrical leads to a piezoelectric device is taught, for example, in U.S. Pat. No. 4,785,704, Musical Instrument Transducer, issued Nov. 22, 1988, to Lawrence R. Fishman. See Col. 2, line 41 et seq. In that patent, the conductors are soldered to the connectors. Also, in U.S. Pat. No. 3,325,580, Musical Instrument Using Piezoelectric Transducer, issued June 13, 1967, to L. M. Barcus et al, is taught coating a piezoelectric plate with a conductive paint to provide electrodes. See Col. 6, lines 15 et seq. See, also, the article by Forrest Mims, III, in Radio-Electronics, referred to above, for a discussion of adhesives and conductive adhesives.

The problem posed is how to connect thin, flat film conductors to connectors and switches, particularly those that are formed by depositing a thin film of conductive inks or paints on a thin film substrate. Soldering or welding connectors and conductors to "painted" films are usually difficult and often unsatisfactory.

SUMMARY OF THE INVENTION

The extension electrical switch system of the invention solves the problem of connecting between connector, conductor and switch, readily, in its preferred embodiment, by constructing, or creating, the conductors, connectors and at least a portion of the switches integrally with each other. That is, the conductors, connectors and switch electrodes are painted, inked, or otherwise deposited or formed, in a continuous fashion on a common film. By "continuous" is meant that the connectors merge without any break in their continuity into the conductors which merge likewise, without any break in their continuity, into the switches.

The device of the invention is particularly useful in providing an extension electrical switch to, in effect, actuate one or more keys of a computer keyboard. However, the invention may be used to actuate, energize or otherwise affect the operation of other electrical equipment.

In one embodiment, one end of the invention is the electrical connector end, the other end is the touch switch end. A conductor lies between the two ends and connects them together. The invention, in the preferred embodiment, comprises a plurality of such connectors, conductors and switches. All are constructed to form a compact, flat, film-like structure. The connectors are not necessarily at the end of the conductors but may be disposed at various locations along such conductors. The same is true of the touch switches.

In the preferred embodiment, the connectors, conductors and switches are all constructed on a base comprised of a single sheet of flat, flexible film, which is a heat-stabilized MYLAR (manufactured by DuPont de Nemours and Co. of Wilmington, Del.) and which is coated to accept conductive and dielectric inks. Another suitable film is LEXAN (manufactured by General Electric, Plastics Division, Sheet Products Section, One Plastics Avenue, Pittsfield, Mass., 01202). Other films are suitable such as neoprene, urethane, vinyl, acrylic or vinyl films available from companies such as 3M, Industrial Specialties Division, 3M Center, St. Paul, Minn. 55144). The preferred film is 7 mils (7 one-thousandths of an inch) in thickness. Thinner films may be used but are subject to degradation under ultra-violet and infrared treatment used in connection with curing the conductors and the dielectric. A thicker film can be satisfactorily used, but such thickness reduces the flexibility of the system.

If it is desired to have a control switch or a panel of switches at an outlying location instead of (or, in addition to,) at an original location, the device of the invention, provides a ready means of providing the control switch or panel of switches at the outlying location. The electrical connector of the invention need only be attached to the desired equipment all of the other electrical connections, between the connector, the conductor and the switch electrodes, or panel of switch electrodes, all having been already made, in the manufacturing process.)

Thus, the device of the invention provides an efficient way of manufacturing wiring harnesses which require operating switches and a wiring harness that is economical and reliable. Further, it allows introduction of operating switches into wiring harnesses as an integral part thereof.

The device of the invention provides a ready means of connecting to electrical equipment as well as a ready means to electrically switch or "affect the operation of" such equipment from an outlying, different location. "Outlying" is intended to include within its meaning, one or more of "additional", "convenient" and "remote".

The device of the invention is easy to handle, easy to install and is easy to operate. Because of the essential film-like character throughout, of the connectors, conductors, and switches, the switch system may be disposed in locations that are ill-adapted for thicker, remote control systems.

For example, the invention finds particularly advantageous use in being connected to printed circuit boards, including the solder pads on circuit boards and the other electrical components on circuit boards. Such circuit boards are used in all kinds of electrical equipment, including computers and the keyboards of computers.

By connecting the electrical switch system to the printed circuit board of the keyboard of a computer, the computer keys may be operated at other locations than at the keyboard of the computer. One side of the printed circuit boards computer keyboard circuit boards and other circuit boards, as well, are comprised usually of printed circuit electrical conductors and solder pads. By connecting the connector of the device of the invention to the solder pads or the conductors for a selected key, one can actuate the same circuitry as such key operates, but from another location. The advantage is that the actuation may be done without having to return the hand to the keyboard. This is quite useful when operating a mouse in connection with a computer.

In another embodiment, the connector end of the invention is adapted to be connected to the pins of a microcircuit package, using the invention described and claimed in my patent application entitled ELECTRICAL CIRCUIT SYSTEM, filed simultaneously herewith and referred to above. Such microcircuit package may contain a microcircuit chip which is a keyboard controller chip, a keyboard encoder chip, PIO chip (programmable input/output interface chip) or other chip. In the preferred embodiment, the connections are made to the pins of the package containing the keyboard encoder chip or the microprocessor chip. Such packages are usually DIPS (dual in-line packages). The connector may connect in piggyback fashion or other fashion to such package.

The invention is particularly suitable as an add-on to a computer and its keyboard, after the computer and keyboard have been manufactured and sold. Inasmuch as the device of the invention, the extension electrical switch system, is film-like in nature, it may be readily disposed within the equipment case or housing, to pass along the top or bottom of a circuit board and thence through the seam or other small opening in the keyboard case.

The operating switch, or switches, may be advantageously disposed on a mouse, mouse pad or on a desk or table surface or elsewhere, by a suitable adhesive. Adhesives and films having adhesives on them may be purchased from 3M, 3M Center, St. Paul, Minn. 55144. There are rubber adhesives, acrylic adhesives, and other synthetic and natural adhesives available. The preferred adhesive for attaching the switch panel to the mouse is a 3M adhesive No. 467. A Mylar film would have such adhesive on both sides. Such film and adhesive would, of course, be on the bottom of the switch panel. It may temporarily be covered by a plastic or a paper, peel-stick or other cover.

By utilizing the device of the invention, previously-selected keys may be operated from the mouse, pad, surface or other location, with less hand motion than if the hand is required to return to the keyboard. The switch or switches may be located on either horizontal, slanted or vertical surfaces. Thus, it may be mounted on a drawing pad or on a wall. The invention allows locating the switches wherever it is convenient or efficient.

Each connector, usually at or near one end of the system, and the electrodes of the switch, usually at or near the other end of the system, in the device of the invention are integrally connected, electrically, to the conductor in the middle part of the system. That is, the connector and switch electrodes are constructed in continuum with the conductor. They are preferably constructed of the same conductive paint which is painted on, vaporized on or otherwise deposited as the conductor, although that is not a firm requirement. It is possible to vary the conductive paint or the method of manufacture from painting, say, to ink printing, spraying or evaporating, as the different portions of the device are constructed, but the important thing, in the preferred embodiment, is that the substrate structure be a continuum (even though the material changes) and the conductive portions thereon be a continuum (even though the conductive material changes). Thus, such elements, the connector, conductor and switch electrodes are integrally constructed structurally, or physically, as well as being integrally constructed electrically.

As mentioned above, the connector end of the invention is adapted to be readily connected to electrical leads, terminals, and active or passive devices. In the case of the computer keyboard, the connector may be connected to the solder pads or electrical conductors of a selected key. Where a number of keys are to be actuated, in effect, the device of the invention may be constructed or adapted to connect several connectors to several solder pads or several conductors. As mentioned previously, the connector end may connect to a microcircuit chip. In any event, the connector makes its electrical connection to the solder pad, conductor or other device by resilience, pressure, adhesive contact or by a combination of such means or by other means. The adhesive may be mixed in with the conductive material of the connector or, in a preferred embodiment, the adhesive may be placed adjacent the connection area and not within the connection area. The connector electrodes are held against the solder pads, in such example, by the pressure of the resilience of the film substrate on which the connector is disposed.

Also, as mentioned above, the connection, to the circuits actuated by the keyboard keys, may be accomplished by a connector which connects in piggyback fashion to the pins of an in-line (single or dual) package of a keyboard chip and connects one or more conductors to one or more pins of the package. The DIP (dual in-line package) offers an advantageous location for making such connections. Connection may also be made to other electrical component packages. This will be discussed in greater detail below. Suitable connectors are disclosed in my related patent application filed simultaneously herewith, entitled Electrical Circuit System, referred to above.

The same conductive material (paint, ink, or other material) may advantageously be used to make the conductors as is used to make the connectors which one connects to solder pads, pins of a dual in-line package or other electrical element. Advantageously, too, the switch electrodes, connected to the conductors, are of the same conductive material. This allows for easier manufacture. One layer of paint may be laid down, being a connector at one location (say, at or near one end,) a conductor at another location (say, in the middle), and a switch electrode at another location (say, at or near the other end). This allows for economical and reliable manufacture. Also, in this way, multiple conductors may be readily manufactured side by side or superposed on each other.

Low voltages are usually involved in such extension electrical switch systems, although the circuits they control may have much higher voltages, from which the switches are isolated. For example, the extension electrical switch system of the invention could be used to control a low voltage signal to a relay, which, in turn, controls a high voltage. This allows extensive use of the device of the invention in the control of industrial equipment.

The touch-type switch is usually comprised of a conductive pad (electrode) on the underside of a flexible plastic which is depressed to cause the conductive pad to momentarily connect two electrodes, which are adjacent each other, lying beneath the conductive pad. When the pressure is removed, the natural resilience of the plastic lifts the conductive pad electrode from the adjacent electrodes. Refinements may be added to identify the switch areas such as by surrounding them with a raised annulus and by giving the pads a "tactile feel", which helps in knowing when the pad is sufficiently depressed. Signal beeps can even be incorporated, through the use of associated electronic circuitry, to signify when the switch is operated. Such touch-type switch is in common use.

Of course, the switch elements may be reversed, in which the two electrodes are disposed on the underside of a flexible plastic which is depressed momentarily to be shorted by the conductive pad electrode lying beneath the two electrodes.

Touch-type switches, in some examples, are designed for the flexible plastic to be moved approximately 5 to 7 mils which is the width of a spacer layer between the switch electrodes and the switch pad which closes them to close the circuit. The pressure required for closing the switch may be approximately 2 to 4 oz., although this is quite variable.

Where the device of the invention has several switches, in a panel-like structure, they may each be identified by some means, such as having printed thereon, the name of the key they replicate. In this manner, selected keys or, more accurately, the circuitry the selected keyboard keys operate may readily be identified and operated from a mouse location, a mouse pad or other more convenient location.

Such switches are often located in a row or column in a panel which is somewhat more rigid and thicker than the flexible film on which the conductors are located.

It is, therefore, an object of this invention to provide an extension electrical switch system.

It is another object of this invention to provide a method of manufacturing an extension electrical switch system.

Another object of this invention is to provide an extension electrical switch system in which the switch electrodes, the conductors and the connectors are integral with each other.

Another object of this invention is to provide a process for manufacturing an extension electrical switch system in which the switch electrodes, the conductors and the connectors are electrically integral with each other.

Still another object of this invention is to provide a process for manufacture of a physically (structurally) integral structure comprising a connector, conductor and switch electrode structure.

Yet another object of this invention is to provide an extension electrical switch system comprising one or more connectors, conductors and switch electrode structure which are all of substantially the same thickness.

It is another object of this invention to provide a method of manufacture of a plurality of extension switches, conductors and connectors in one structure.

It is another object of this invention to provide a plurality of extension switches which may readily be connected to electrical circuitry, including in particular, printed circuit boards.

Another object of this invention is to provide a switch system which may readily be connected or disconnected from electrical circuitry.

It is an object of this invention to provide an extension switch system which is comprised essentially of an elongated, thin, flat film.

Still another object of this invention is to provide an extension switch system comprising a plurality of switches, conductors and connectors for readily connecting to compute keyboard circuitry, for actuating, from a more convenient location, the circuits actuated by preselected keys of said keyboard.

A still further object of this invention is to provide an extension electrical switch system for a computer keyboard which is of a configuration suitable to fit partially within the case of a computer keyboard and pass through a seam or hole in said case and be attached to a mouse, a mouse pad, a desk or other convenient location.

Another object of this invention is to provide an electrical connector which may be readily attached to existing electrical circuitry.

Still other objects and features will become apparent to those skilled in the art from the following drawings and description.

BRIEF DESCRIPTION OF THE DRAWINGS

FIG. 6 shows the connector end of an extension switch system in which the upwardly facing conductors are now turned over in order to be attached to selected solder pads in a different direction on the circuit board.

FIG. 7 shows the connector end of the extension switch system as it might be disposed on a circuit board to make connection with selected solder pads.

DESCRIPTION

Figure 1:
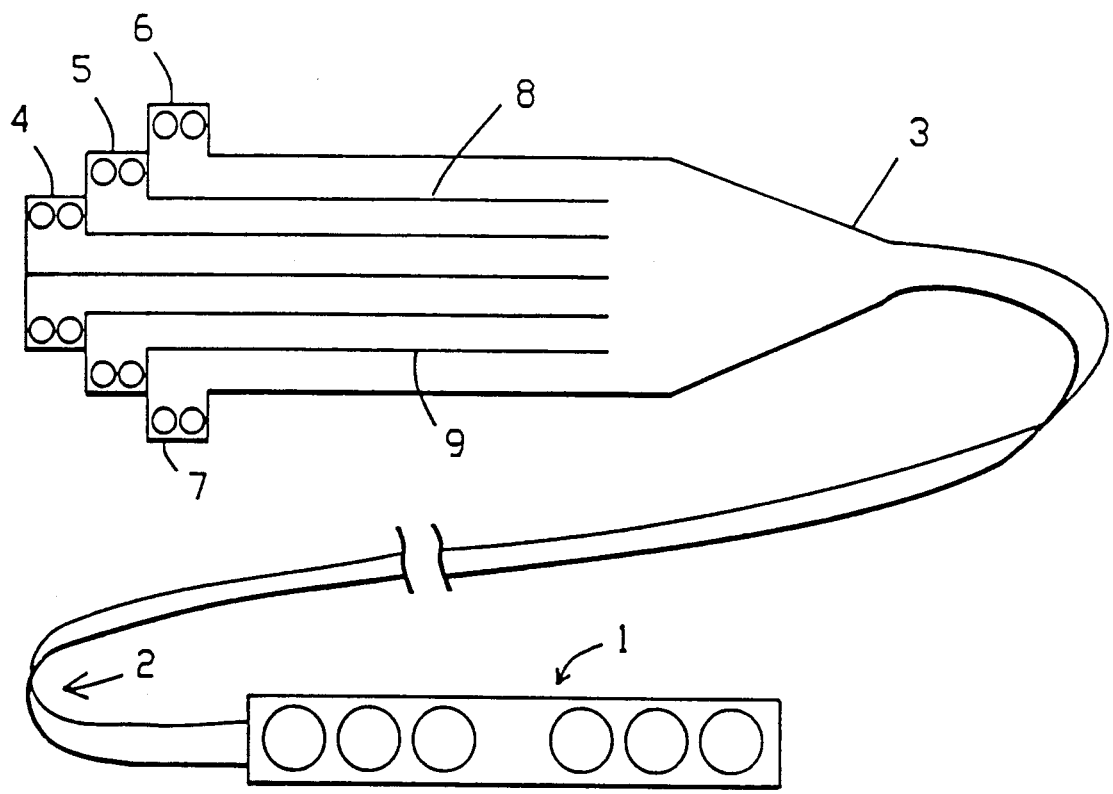
FIG. 1 shows an extension electrical switch system comprised of a plurality of conductors having a plurality of connectors at one end and a plurality of switches at the other end.

FIG. 1 shows an extension electrical switch system having a panel 1 comprised of six operating switches, a conductor-carrying film 2 having a plurality of conductors which separate, or fan out, at location 3 and connect to connectors such as 4, 5, 6 and 7. The connectors are shown in a cascade construction, but their shape and location at or near the end of the conductors may be designed a desired. The entire extension switch system is constructed on a thin, flat film which is very flexible and allows for easy connection to a circuit board and for easy disposition within a computer keyboard case. Also, it allows easy movement of the switch panel, if, for example, it is attached to a mouse.

The conductor film 2 extends unbroken from the connectors 4, 5, 6 and 7 into the switch panel 1 and forms one layer thereof. Panel 1, which is comprised also of other layers as described hereafter, is, of course, thicker and less flexible than conductor film 2.

In the embodiment shown in FIG. 1, the conductors which fan out at location 3 may be disposed in layers prior to fanning out. Each layer is insulated with a dielectric. After fanning out, the structure is such that each connector and its conductor may be readily separated from the others by being scored or cut as shown at lines 8 and 9.

In the preferred embodiment, the conductors are simply formed on the top and on the bottom of the conductor-carrying film 2. A dielectric layer is then deposited on each of the bottom and the top to cover the conductors. If the film 2 is wider than desired, because of numerous conductors, it may be readily slit between conductors from the panel 1 to the fanout location 3, to allow superposing part of the conductors over the rest, by an adhesive, clip, spiral case or other means.

Figure 2:
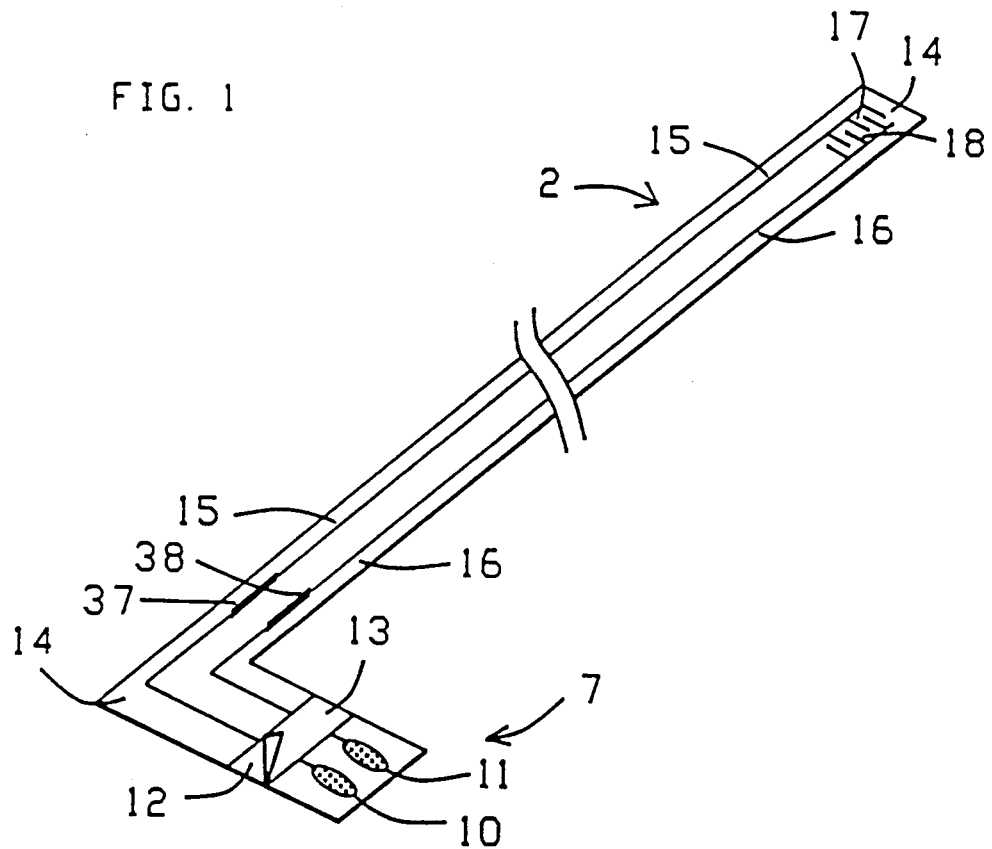
FIG. 2 is a view of the integral structure of the extension electrical switch system, showing, at one end, a connector having two connector pads, the conductor associated with each pad, an adhesive strip which is covered by a peel-and-stick paper, and, showing at the other end, the electrodes of the touch-type switch.

FIG. 2 shows connector 7 of FIG. 1 in greater detail. The connector is shown with the connector pads 10 and 11 facing upwardly and exposed from the top. Connector pads 10 and 11 make connection to the solder pads when turned over and placed thereon. A non-conductive adhesive is disposed in area 12 and it is covered by peel-and-stick paper 13, adjacent the connector pads 10 and 11. The adhesive holds the conductor film 2 and connector 7 to the circuit board and the connector pads 10 and 11 are held against solder pads by the resilience of the film substrate 14 on which the conductors are disposed. In other embodiments, a conductive adhesive may be disposed on the connector pads 10 and 11 in order to adhere them to the solder pads. The connector pads may also be made of a conductive adhesive. The connector pad is then pressed down onto the solder pad, to make and hold the electrical and physical connections. Conductive epoxy is one of several such suitable conductive adhesives which are readily available and which may be used.

Conductors 15 and 16, which are, of course, covered with a dielectric layer, connect to the connector pads 10 and 11, which are exposed, and extend in the other direction toward the switch end of the extension switch system, where they are shown, in FIG. 2, terminating in the switch electrodes 17 and 18. As can be readily appreciated, the switch electrodes may be momentarily connected to each other, and thus, effectuate the switching purpose by a simple, superposed, conductive pad not shown, adapted to be pressed momentarily into connecting the two electrodes together electrically. Such conductive pads, as well as connector pads 10 and 11, are preferably larger areas comprised of the same conductive ink as the conductors. Thus, the connector 7 and its connector pads 10 and 11 are electrically and structurally (physically) integral with the conductors 15 and 16 and the switch electrodes 17 and 18. Such conductor pads 10 and 11 are desirably coated with a graphite ink to stabilize the silver conductive ink and prevent its degradation.

As can be seen in FIG. 2, each electrical path, that is, the connector pad of the connector, the conductor and the switch electrode, are all constructed integrally with each other or in "continuum". That is, they are unbroken, or continuous, in their electrically-conductive structure and so, require no further connections to be made between them. This is preferably accomplished by using the same conductive material, whether paint or ink, or otherwise, throughout. The conductive material may vary, in density, thickness, width or material used, but it is preferably in "continuum", or, in other words, a continuous conductor.

Similarly, as to the physical, or structural, construction, the film substrate 14 upon which the connector pads, conductors and switch electrodes are constructed, is preferably integral or in "continuum". That is, the substrate structure, while it may vary as to material, thickness, or width, is preferably unbroken, or continuous, and thus provides the necessary strength to carry the electrical structure which is somewhat fragile and must be firmly held by a suitable substrate. Such structure of "continuum" also allows for economical manufacture because the connectors, conductors and switch electrodes are substantially the same.

FIG. 2 also illustrates another way in which connection may be made to a circuit board. Conductors 15 and 16 may be exposed to form connector pads 37 and 38, in proximity to adhesive area 12. Such connector pads could be held in contact with printed circuit lines on a printed circuit board or other circuit lines, by the adhesive area 12. Similarly, connector pads 37 and 38 may have a conductive adhesive on them, to hold them in engagement with circuits.

A non-conductive adhesive, similar to that shown at 12, may also be disposed on the dielectric covering the conductors 15 and 16, to hold the connector pads 37 and 38 or connector pads 10 and 11 in contact with other electrical elements.

Figure 3:
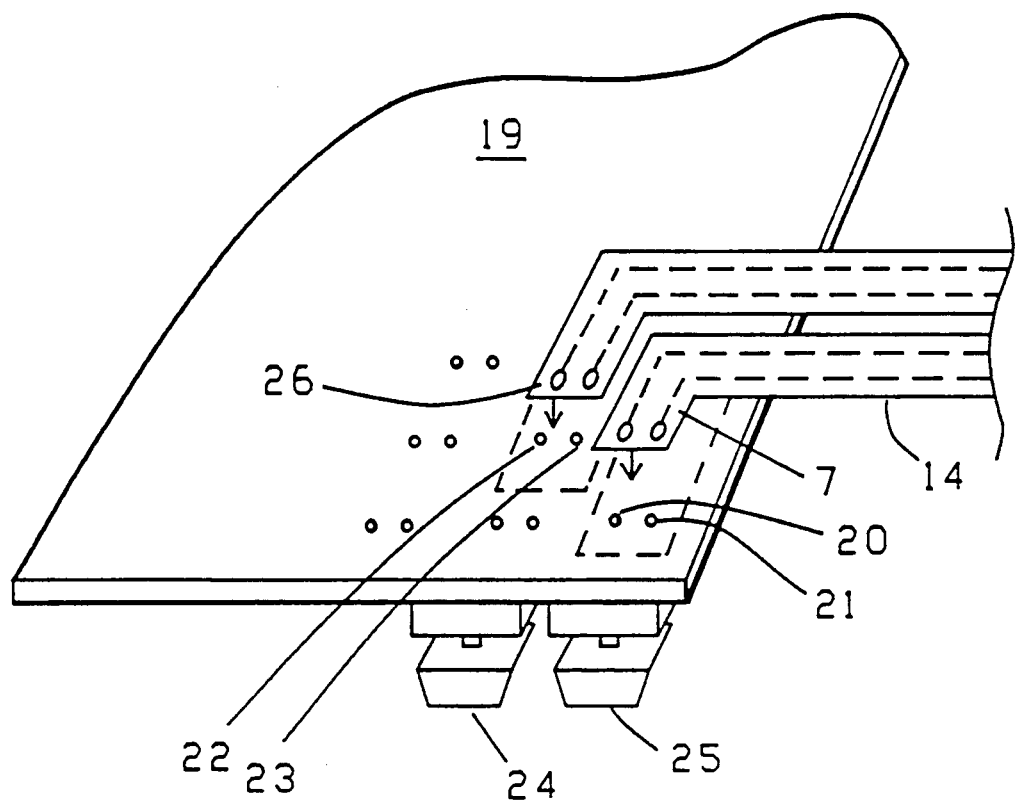
FIG. 3 is a perspective view of the underside of the printed circuit board of a computer keyboard, showing two keyboard keys, a number of solder pads associated with the keyboard keys and two connectors each having two connector pads on their underside, and the conductors associated therewith. The pads and conductors are on the underside of the film but are visible through the film. The conductors are, of course, covered with a dielectric on the underside of the film to prevent their short-circuiting other solder pads and conductors on the printed circuit board.

FIG. 3 illustrates how a connector 7 is attached to the underside of a keyboard printed circuit board 19 (which is shown upside down) having solder pads such as 20, 21, 22 and 23. The keys 24 and 25 of the computer keyboard illustrate the relative positions of the keys and their associated solder pads. It may be seen that connector 7 is in position to be attached to the solder pads for key 25. When so attached, all the functions performed by key 25 may be performed remotely by the extension switch system.

Connector 26 may be attached to solder pads 22 and 23, but because of the flexible nature of the film substrate 14, and the cut or scoring between conductors, connector 26 may be moved and attached elsewhere. It cannot be elongated. Nevertheless, because of the flexibility of the substrate, it can be turned or twisted to reach a particular location.

Figure 4:
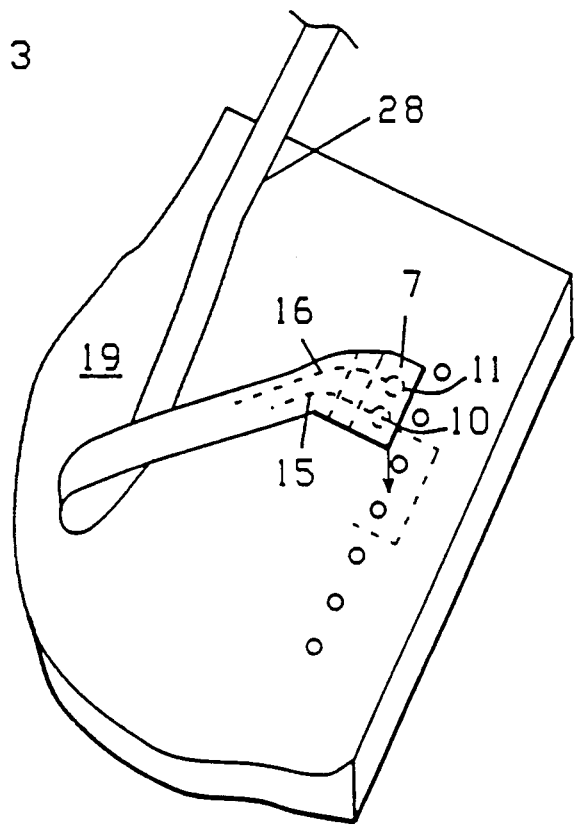
FIG. 4 shows a connector and the flexible conductors which are turned over in order to reach particular solder pads located in another direction.

FIG. 4 shows connector 7 which must be turned over to reach a desired location on the underside of circuit board 19. The flexible conductor portion 28 allows for easily manipulation and location of connector 7. It is noted that the connector, after being turned over, must have its connector pads 10 and 11 on the underside in order to connect to the solder pads. In other words, when manufactured, the connector pads must have been on the top side.

Figure 5:
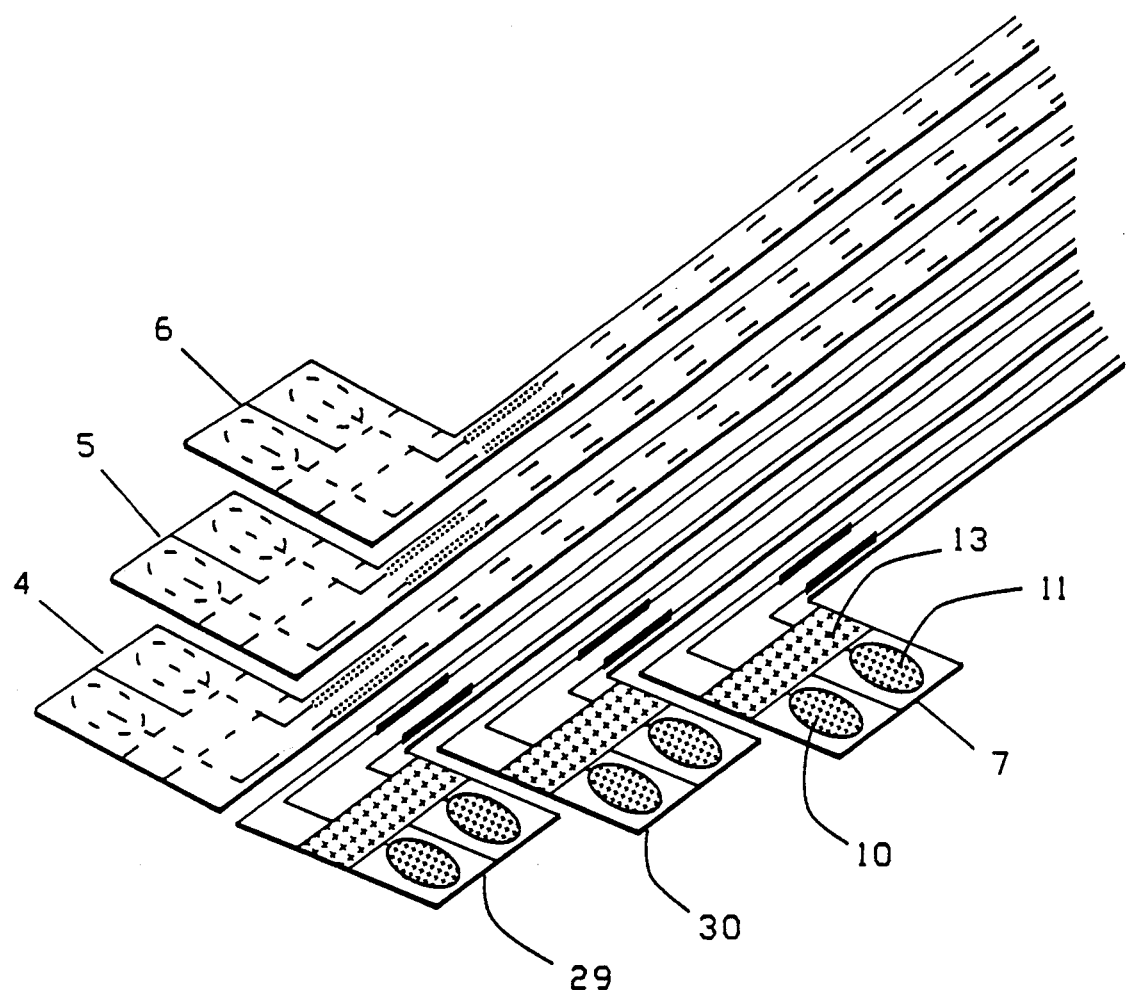
FIG. 5 shows the connector end of an extension switch system, showing the flat film of numerous conductors terminating in connectors, in which half of such connectors are constructed facing downwardly and the other half are constructed facing upwardly for disposition as described in FIG. 4. It is noted that the connectors are separable and constructed in cascaded formation in order to provide ready separation, for connection to spaced-apart locations, as shown in FIG. 6.

FIG. 5 shows the connector end of an extension switch, showing, in particular, connectors 4, 5, 6 and 7 with their associated connector pads. Connector 7, for example, has connector pads 10 and 11. Peel-and-stick paper 13 covers an adhesive for attaching and holding the connector pads to the desired electrical circuitry. As explained previously, such circuitry to which the connectors are attached may not only be solder pads, but may also be other conductive areas on the circuit board, such as electrical conductors or other electrodes. "Electrodes" includes within its meaning, such solder pads, conductive areas, conductors, terminals, electrical leads, or pins and any other electrically-conductive object. Each connector, may be separated from the other connectors and attached at a desired location. It may be seen from the drawing that connectors 4, 5, and 6 have been manufactured with the connector pads facing downwardly. On the other hand, connectors 7, 29 and 30 have been manufactured with the connector pads facing upwardly.

Slits or perforations, which allow ready separation, may be made between the connectors 4 and 5 as well as between 5 and 6 and between other connectors and between conductors, as may be desired.

FIG. 6 shows the adaptability of such construction, showing how connectors 7, 29 and 30 may be turned over to be properly attached at a location quite apart from where connectors 4, 5 and 6 are attached.

FIG. 7 further illustrates how particular connectors, such as 4 and 29 may be attached even though, as manufactured, they originally faced upward. Because of the flexible nature of the extension switch system, the connectors may simply be turned over or twisted and properly attached.

Figure 8:
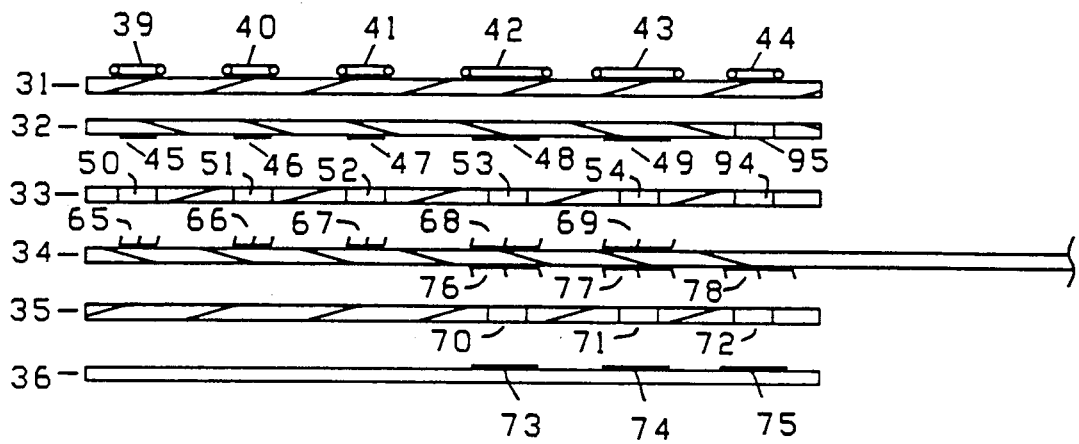
FIG. 8 is an exploded cross section view of a panel of touch-type switches, showing the layers of a typical switch. Touch areas 42 and 43 actuate two switches each, which is more clearly seen in FIG. 9. The side view of film 34 is altered slightly to better illustrate electrodes 65, 66, 67, 68, 69, 76, 77, and 78.
Figure 9:
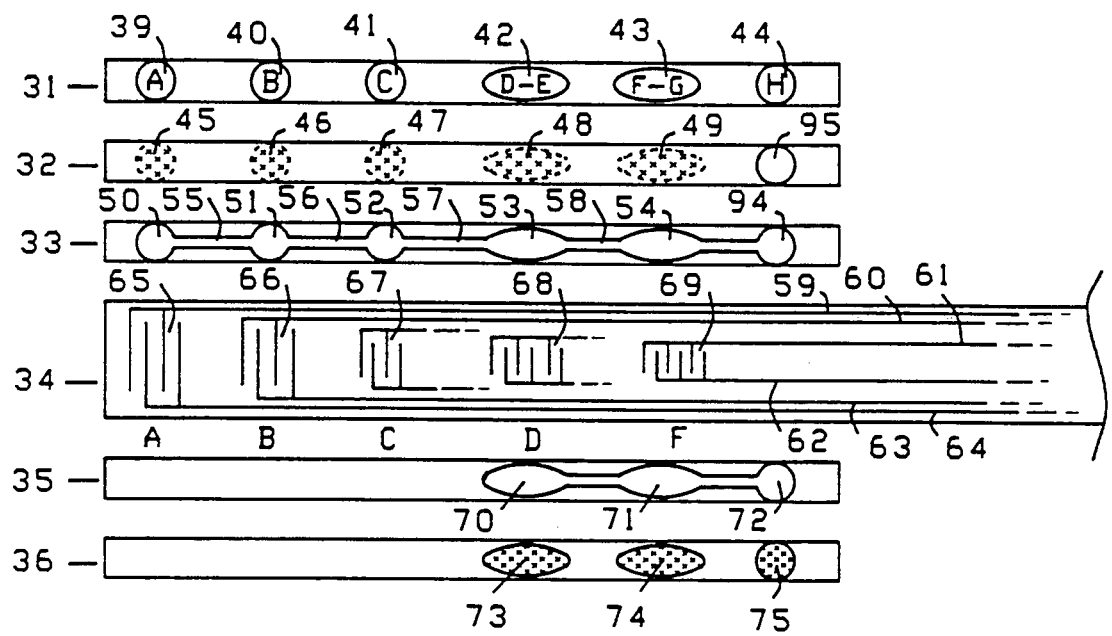
FIG. 9 is a top view (exploded) of each element of the switch of FIG. 8

FIGS. 8 and 9 are illustrations of the component parts of the switch panel 1 at the switches end of the extension switch system. FIG. 8 is an exploded cross-section view of switch panel 1 and FIG. 9 is a top view (exploded) of each of the layers of panel 1 shown in FIG. 8.

On top is an identifying layer 31 which may simply be embossed or inked or printed or combination thereof. Preferably, to avoid wearing away, inking or printing is done on the underside, using a transparent film. It may be of paper or plastic, but is preferably a transparent plastic, such as Lexan, or, possibly, Mylar, about 3 to 5 mils thick.

Annuluses such as are shown at 39 to 44 (formed, printed or inked) may disposed to provide ready identification of switch areas which are to be pushed when it is desired to actuate the switch. The identified switch areas 39 to 44 need not be circular or elliptical, but may also be rectangular or other shape.

The next layer 32 of Mylar, Lexan or other suitable film such as those mentioned has a thickness of approximately 7 mils and carries five conductive pads, 45 TO 49, FIGS. 8 and 9, inked or painted on the underside thereof. It also may have a hole therethrough as shown as 95. The conductive pads of conductive ink coated with a stabilizing graphite ink provide the switch connector with means to electrically connect the switch electrodes together when the pads and the electrodes are pressed together. For example, conductive pad 45 on layer 32 provides the switch connector means to the electrodes 65 on layer 34 and electrically connects them together when layer 32 and layer 34 are pressed against each other through hole 50 in spacer layer 33. As may be appreciated, either may be pressed against the other. From looking at FIGS. 9 and 10 together, it may be seen that when area 44 is pressed, conductive area 75 is pressed against switch electrodes 78, which electrically connects the switch electrodes together. Thus, a conductor and its mating conductor are electrically connected together. Viewed in another way, an electrical switch is closed from one conductor to the other, completing an electrical circuit.

Either the connector means may be pressed against the switch electrodes or the switch electrodes may be pressed against the connector means.

It is to be noted that layers 31 and 32 may be combined in a single film of Lexan 7 mils thickness if the annuli (39, 40, etc.), printing and conductive pads (45, 46, etc.) are created on the film. For example, in making a single layer of 31 and 32, the layer would be embossed to provide the annuli on top, it would be printed with identifying symbols on the underside, then a background paint (say, blue) would be painted over the symbols, then the conductive pad would be created on the underside on the background paint. The symbols would still be quite visible from the top of the film.

A spacer film 33 (Mylar, Lexan or other suitable film such as those mentioned) is next, having a thickness of 7 mils to provide the necessary stiffness. It has been found that 5 mils is too easily actuated and does not offer enough pressure resistance to operate effectively. The spacer film 33 has holes such as 50 to 54, to allow conductive pads 45 to 49 to pass through and electrically connect pairs of switch electrodes 65 to 69 on film 34. Additional holes, such as 94, may also be included in the spacer film to permit, by pressure on annulus 44, actuation of the conductive pad, such as 75, of additional switches.

Hole sizes, in the spacer film 33, may be approximately ¼ inch in diameter.

It is to be appreciated that the switch electrodes are not limited to pairs. Looking at FIG. 10, there are four switch electrodes for four conductors, shown at 76. The switch connection means (conductive pad 73) must, of course, be large enough to connect all four switch electrodes together. By electrically connecting all four switch electrodes, multiple keys or effects may be actuated by a single touch-type switch. In fact, in FIG. 8, with the construction illustrated in FIGS. 9 and 10, the annulus 42 area, when pressed, would electrically connect each of three conductors to their respective mating conductor.

On the spacer film 33, the holes 50 to 54 and 94 are connected by small channels, such as 55 to 58, of about 0.1 inch in width, to allow air to move back and forth when the switches are depressed. In some instances such channels could lead to the atmosphere. However, channels such as those shown are preferred because they permit no outside air to enter and are thus subject to little or no oxidation or degradation of the conductive pads 45 to 49 or the switch electrodes 65 to 69.

In FIG. 9, it may be seen that film 2 (layer 34) carries the continuum of conductors, switch electrodes and connector pads (not shown). Conductors such as 59 to 64 extend from the switch panel 1 to the connector end of the switch system. It is noted that layer 34 may also carry another set of conductors and switch electrodes on its underside.

It should be noted that film layer 34 may extend through and beyond panel 1, utilizing the methods taught herein. That is, the switch panel need not be located at the end of the film 34, but may be disposed intermediate its ends and the ends of its conductors. So also may the connector portions of the film be disposed intermediate the ends of the conductors of the film.

At the switch panel end, shown in FIG. 9, the conductors terminate in switch electrodes 65 to 69 (FIGS. 8 and 9), disposed directly under holes 50 to 54, and conductive pads 45 to 49, respectively. The conductive pads 45 to 49, of course, provide the switch connector means for the switch electrodes 65 to 69. Such switch structures are also disposed directly under identified switch areas 39 to 43, respectively.

The conductive ink, or paint, used in making the conductive pads, of film layer 32, the conductor lines 59 to 64 and switch electrodes 65 to 69 (of film layer 34), may be any suitable, conductive ink.

A specific ink which is suitable in making connectors, conductors, switch electrodes and switch connectors is DuPont polymeric thick film conductor composition 5007 which is available from E. I. DuPont de Nemours & Co. (Inc.), Electronic Products Department, Component Materials Division, Wilmington, Del., 19898. Another suitable ink is a silver vinyl polymer conductive coating, 725 A (62-54) available from Olin Hunt Specialty Products Inc., 5 Garrett Mountain Plaza, West Paterson, N.J. 07424. Other manufacturers provide similar, suitable inks which may be applied to films by painting, printing, plotting, screening or other graphical reproduction methods. The ink must be capable of flexing with the film and not cracking or breaking when flexed. Care should be taken in following the manufacturer's specifications in applying and curing. Infrared and heat are often used in curing conductive inks and care must be taken in the process.

Of course, the conductive ink must be covered in most places with a dielectric layer. A suitable dielectric composition which may be applied in a manner similar to that used in applying the conductive ink, or by broad brush application or otherwise, is an ultraviolet-curable, dielectric polymer thick film ink, 26NCP68, available from Olin Hunt at the address given above. It is an acrylate ester. Another dielectric ink which has been found to be well-suited for use is CL-2, an ultraviolet texture ink, available from Nor Cot, 506 Lafayette Ave., P. O. Box 668, Crawfordsville, Ind., 47933. Such dielectrics are screened on because the conductive pad areas and conductive switch electrode areas must be left exposed. The curing of such dielectrics must follow the manufacturer's specification which usually prescribes infrared or heat curing.

Such dielectric inks are screened, printed or painted on the film and then cured in accordance with the manufacturer's specifications. Screening is most often used in order to achieve the desired resolution of conductor lines which may be as thin as 12 micrometers (metric), but are preferably on the order of one mil (one-thousandth of an inch) thick. If screened on, it is desirable to stroke the ink twice to get it sufficiently thick. The manufacturers specifications for the particular conductive ink should be followed, of course. The conductors may be on the order of 20 mils to 30 mils wide or as otherwise desired. It has been found where space is a consideration, 20 mils conductor width is satisfactory. Where the conductors can be broadened, a conductor 30 mils wide is desirable inasmuch as it provides less resistance. The conductors are spaced approximately 20 to 30 mils apart.

The conductive pads 45 to 49 are approximately ¼ inch in diameter, but, of course, should be large enough to provide good contact between the switch electrodes, when depressed against them. The conductive pads, as stated before, are coated with graphite to stabilize them. Such graphite ink is available from Olin Hunt Specialty Products, mentioned above.

Stainless steel, Dacron and other polyester screens of from approximately 200 to 350 mesh have been found suitable for printing the conductors, connectors and electrodes. A polyester screen, having a mesh of about 280, is preferred in creating the conductive pads, conductors, switch electrodes, and dielectric coating. The conductors are screened twice to obtain the preferred thickness.

FIG. 9 shows that beneath conductor and switch electrode layer 34 lies another spacer layer, 35, having holes 70, 71 and 72. Holes 70 and 71 are shown as elliptical in order to cover a wider area.

Bottom film layer 36 has on its upper surface, three conductive pads 73, 74 and 75.

Figure 10:
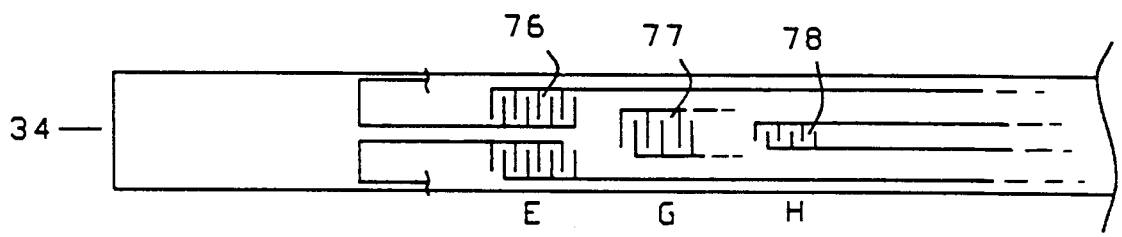
FIG. 10 is a bottom view of the conductor layer of the system, showing switch electrodes 76 and 77 which are closed simultaneously with switch electrodes 68 and 69 respectively, by touch pads 42 and 43 of FIG. 9.

FIG. 10 shows the underside of layer 34, illustrating that it has three sets of switch electrodes, 76, 77 and 78 (visible also in FIG. 8). It is noted that when the conductor pad 73 is actuated, four conductors are connected together at 76, rather than just two as in the other switches which are shown.

It is noted that conductive pads 73, 74 and 75 actuate (electrically connect) switch electrodes 76, 77 and 78 through spacer holes 70, 71 and 72, upon actuation from the top of the switch panel, by pressure on identification areas 42, 43 and 44, respectively. In some cases, it may be desirable to include hole 95 in film 32 and hole 94 in film 33 to permit annulus 44 to actuate switch electrodes 78 against conductive pad 75. In other cases, such holes 95 and 94 are not required for actuation of annulus 44 to be effective in causing switch electrodes 78 to be pressed against conductive pad 75.

Pressure on identification area 43 actuates switch electrodes 69 and 77, actuating two switches at once. It is also noted that pressure on identification area 42 actuates (electrically connects) two sets of switch electrodes, 68 (connecting two conductors) and 76 (connecting four conductors). Thus, three switches are actuated from one touch-type switch 42 Such actuation of two switches, or three switches, by one pressure area, allows multiple switches to be operated simultaneously. This is often required on a computer keyboard, where it is desired to operate a control, command or alternate key along with other keys.

A suitable dielectric, such as previously described, is used to cover (say, by screen printing, spraying or brushing) the electrical conductors of the extension electrical switch system in order to prevent shorting and oxidation or other degradation of the conductors.

If multiple layers of conductors are used, care must be taken that the deposited dielectric is without defect and does not have spaces or holes therethrough. Otherwise, silver migration and shorting may occur.

The several layers (31 to 36) of the switch panel 1, must all be attached to adjoining layer(s), therefore, the film may be purchased with an adhesive coating. An array of suitable, adhesively-coated films are available from by 3M, Industrial Specialties Division, 220-7E, 3M Center, St. Paul, Minn., 55144. Applicant has found that the switch panel layers may advantageously be comprised of films as follows:

top layer, GE's Lexan, 7 mils (combined with the conductive pad layer);
spacer layer, Mylar, 7 mil film, double-coated with 3M 467 adhesive (top and bottom);
conductor and electrode layer, Mylar, 7 mils;
bottom spacer layer, Mylar, 7 mil film, double-coated with 3M 467 adhesive (top and bottom);
bottom layer, Mylar, 7 mils.

It has been found that although the top spacer layer 33 should be 7 mils thick to require sufficient pressure to actuate it, the bottom spacer layer 35 may be, say, 5 mils or thicker. It can be arranged, if desired, that because of the relative thickness of the spacer layers or the relative stiffness of the film 32 and the conductor layer 34, that electrodes 68 will be contacted and closed by conductive pad 48 before pad 73 is contacted by terminals 76. In other words, one switch may be actuated prior to the other, where both are operated by a single touch-type switch area. In this way, a command key on a computer keyboard could be actuated before the additional key is actuated.

It is to be readily understood that adhesives may be used between layers; but if the spacer layers are Mylar film, it is readily available coated with adhesive such as 467 from 3M, as mentioned above. The Mylar may be double-coated with adhesive (top and bottom) so that it holds itself to two other layers. If layers 31 and 32 are combined into a single layer, and the spacer layers are coated with adhesive, top and bottom, no additional adhesive may be necessary in the switch panel 1.

It is to be appreciated that a third layer of conductors may be disposed on film layer 34 by depositing a first dielectric over the first layer of conductors and depositing the desired third layer of conductors on such dielectric and covering such conductors with a second layer of dielectric, but leaving all of the electrode areas exposed so they can be appropriately actuated. Thus, multiple layers of conductors may be constructed in much the same fashion the two layers on opposite sides of film 34. If such structure is used, a fan-out of conductors, to a single layer, is desirable at the connector end of the extension electrical switch system, as shown at 3 in FIG. 1. Fan-out could also be used at the panel end to permit placing touch annuluses side-by-side in a wider array. If fan-out of conductive layers is not used at the panel end, the interior layer of conductors might extend beyond the termination at the switch electrodes of the outer layer of conductors so the switch electrodes of the interior layer may be exposed to their respective conductive pads. This would permit a single, upper spacer layer to be used for the first and third layers of conductors.

Figure 11:
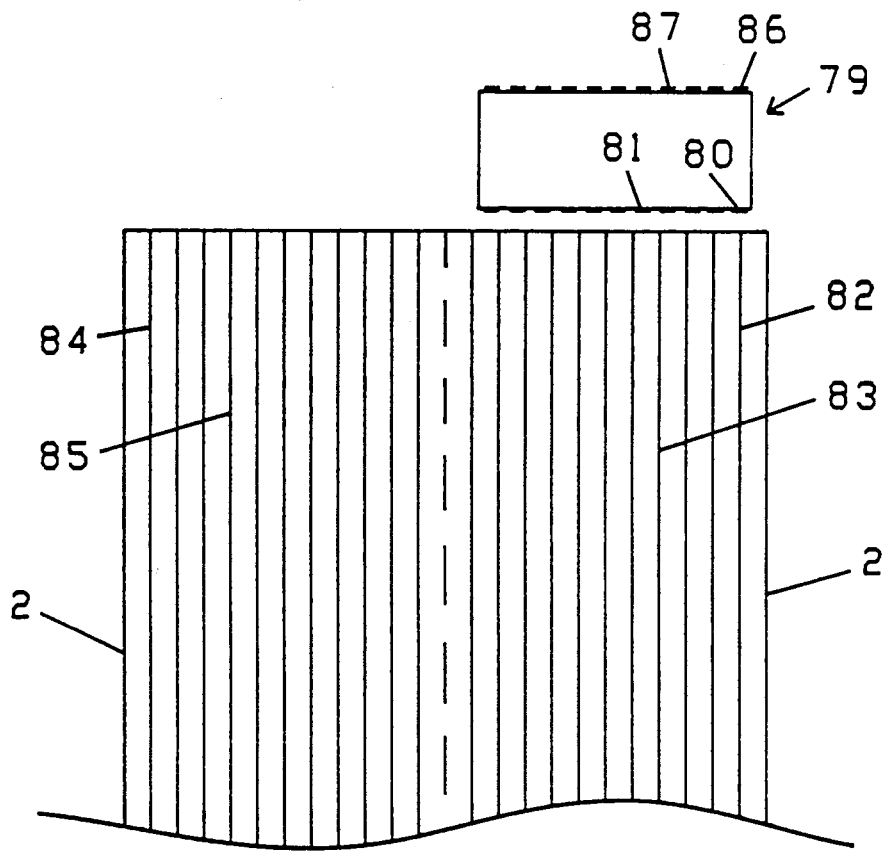
FIG. 11 is a top view of a DIP having electronic microcircuits therein, and its pins, together with a view of the end of an associated film, showing the conductors thereon to be used as a connector to the pins of the DIP.
Figure 13:
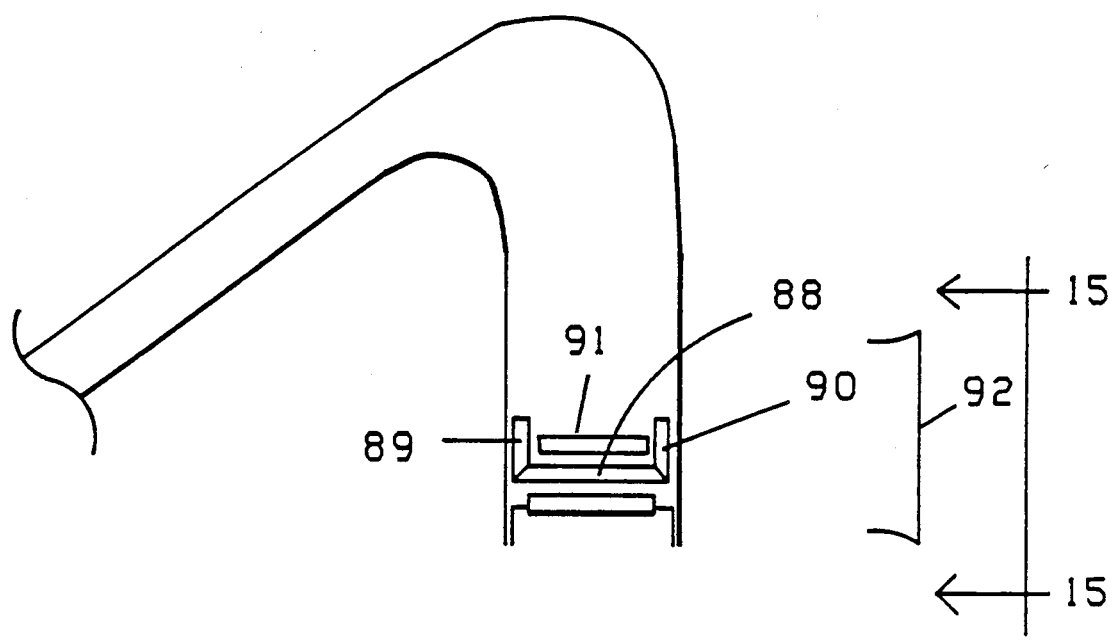
FIG. 13 is another end view of a DIP and the connector assembly showing the DIP having a film holder disposed on top thereof and having a spreader inserted in the film holder which holds the film. The spreader spreads the two film halves and moves the conductors into positive engagement with the pins of the DIP.
Figure 14:
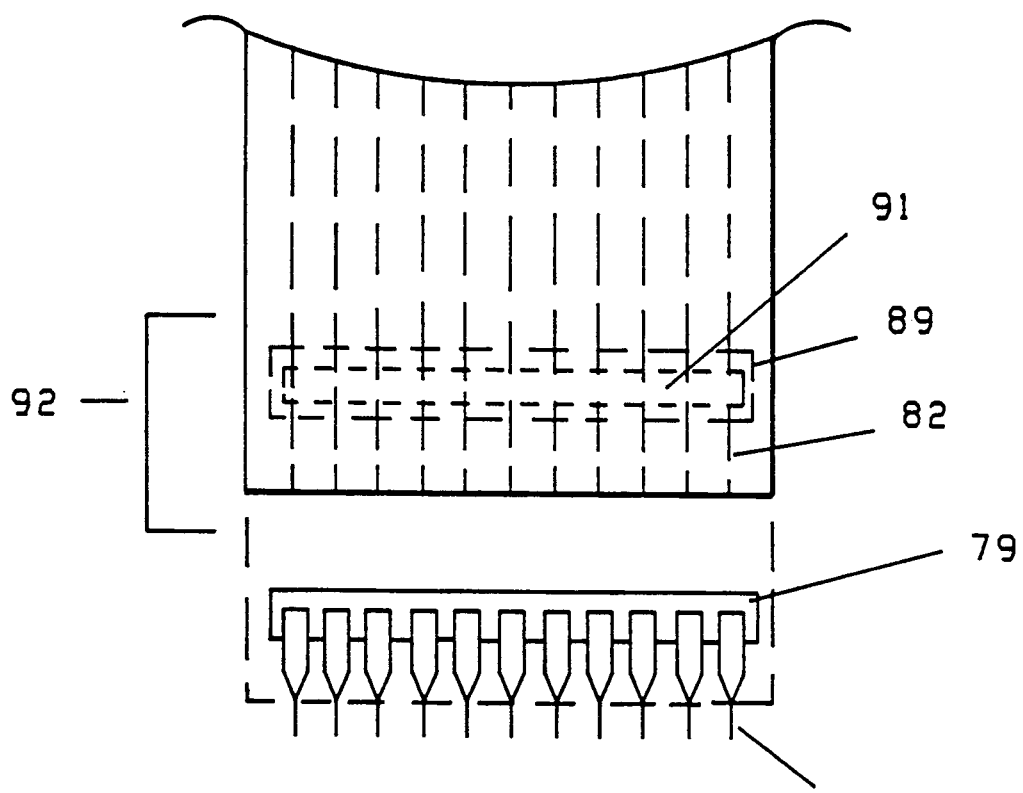
FIG. 14 is a side view of the connector assembly, showing the film prior to the DIP and its leads being moved into engagement with the film and its conductors. The film holder and its spreader are illustrated by hidden lines.
Figure 15:
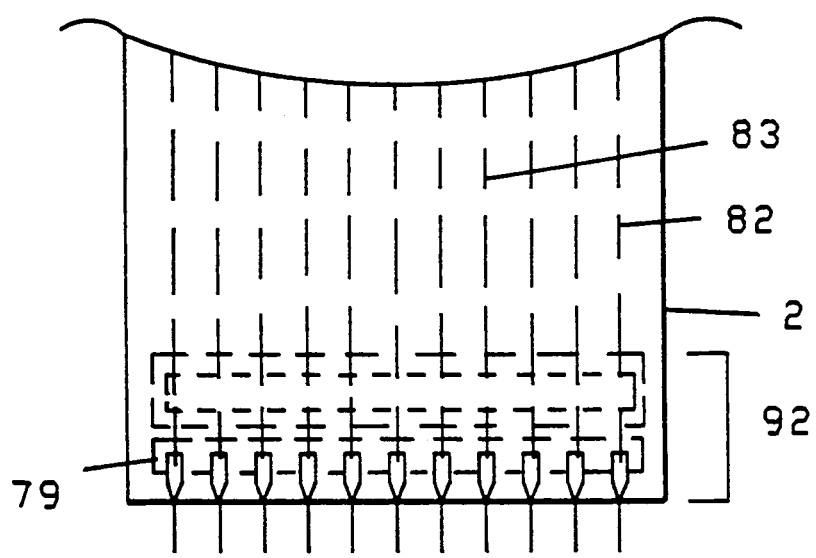
FIG. 15 is a side view of FIG. 13, the connector assembly, showing the film after the DIP and its leads being moved into engagement with the film and its conductors, and showing the film's numerous conductors held in engagement with the leads of the DIP.

FIG. 11 illustrates a means and method of connecting to a DIP (dual in-line package) or other electronic package of a microcircuit. The DIP 79 has pins extending from its sides, such as at 80, 81, 86 and 87. In order to be connected to the conductors on film 2, the DIP 79 would have to be rotated 90 degrees about its longitudinal axis. In other words, the pins of the DIP 79 would lie parallel to and along the conductors on film 2. Reference to FIGS. 13, 14 and 15 help to visualize how the DIP is disposed between the two halves of film 2.

Film 2, with conductors such as 82, 83, 84 and 85 is adapted to be connected to the pins of DIP 79. It is noted that the film 2 may be cut (as shown by a dotted line), at least partially along its length. This permits folding half of the film over and attaching its connector portion (the end of its conductors) to pins on the opposite side of the DIP. For example, after film 2 is folded in half, conductors 84 and 85 could then be placed in contact with pins 86 and 87. Also, pins 80 and 81 could be placed in contact with conductors 82 and 83.

Figure 12:
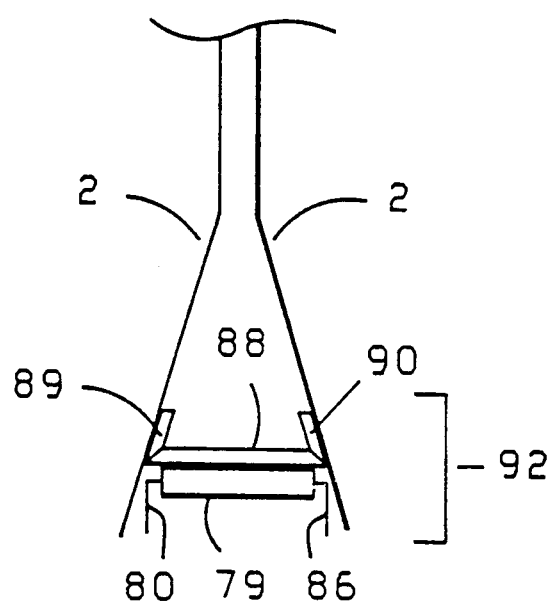
FIG. 12 is an end view of a DIP (dual in-line package), showing the film holder disposed on top of the DIP and the held film, having conductors thereon which are to be held in engagement with the pins of the DIP. The conductors have not yet been finally engaged with the pins.

FIG. 12, an end view of DIP 79, helps in visualizing such connections between the conductors and the pins. A film holder 88 (which is a U-channel) has two flexible side panels 89 and 90, each of which is fixedly attached to one of the two halves of film 2. This is accomplished by the two flexible panels 89 and 90 of film holder 88 being adhered or glued by a non-conductive adhesive to film 2, near the end thereof. In FIG. 12 the conductors of the film 2 are not yet in positive contact with the pins of the DIP 79.

FIG. 13 shows how the two halves of film 2 and the electrical conductors thereon may be conveniently flexed to extend to a desired location. It also shows how the conductors of film 2 are brought into positive engagement with the pins of DIP 79, by a spacer 91 being inserted in film holder 88 and forcing flexible panels 89 and 90 outwardly. The stiffness of film 2 holds the conductors of the film 2 firmly and positively against the pins of the DIP. Film holder 88 may be glued to DIP 79 for additional rigidity and to more firmly hold the connector (and its conductors) in contact with the DIP (and its pins). Spacer 91 may be held in place simply by tightness of fit or by a small amount of adhesive.

It has also been found that if each conductor is separated by a short cut, say, for approximately the length of the contact with the pin from its adjoining conductor, it more readily fits to its particular pin on the DIP.

In addition to using the resilience of film 2 to hold its conductors against the pins, a conductive adhesive may be used to attach the conductors to the pins. Resilience and adhesive may be used singly or together, to assure a reliable electrical connection.

Connections may be made, or enhanced, in certain cases by conventional means, although elevated temperature must be closely controlled or they would likely cause a problem with the paints and films used in the invention. Such conventional means of making electrical connections are, of course, soldering, heat fusion, welding, ultrasonic bonding, and other methods. They may be found suitable provided they do not cause degradation of the film or the conductors by reason of their elevated temperature.

FIG. 14 shows connector 92 prior to its being connected to the DIP 79. Connector 92 is comprised of the end portion of film 2, its conductors, film holder 88, its panels 89 and 90 and space 91. The relative locations of panel 89 (adhered to the film 2) and its spacer 91 are shown. It can be seen how the conductors (such as conductor 82) on film 2 may be disposed to contact the pins (such as pin 80) of DIP 79, when the connector 92 is in engagement with the DIP 79.

FIG. 15 is a side view of FIG. 13 the connector end of the film and it illustrates connector 92 in engagement with DIP 79. The conductors on the film 2 are in firm engagement with the pins of the DIP.

Although specific embodiments and certain structural arrangements and process steps have been illustrated and described herein, it will be clear to those skilled in the art that various other modifications and embodiments may be made incorporating the spirit and scope of the underlying inventive concepts and that the same are not limited to the particular forms herein shown and described except insofar as indicated by the scope of the appended claims.

I claim:

1. An extension electrical switch system for connecting to at least one of electrical circuitry or an electrical component, said switch system comprised of at least one pair of elongated, electrical conductors forming at one location at least a pair of switch electrodes, switch connector means disposed to electrically connect at least a pair of said switch electrodes together when said switch connector means and said switch electrodes are pressed into contact with each other, and wherein each said conductor is formed into connector means at another location, said connector means comprised of said conductors disposed on a flat, flexible film and further comprised of connector pads disposed on said film and wherein at least some of said connector pads and underlying film are separable from the other of said connector pads and their underlying film, and thus adapted for making separate electrical connections to said electrical circuitry or said electrical component, whereby the function of an electrical switch may be executed by the extension electrical switch system.

2. The switch system of claim 1 in which each said conductor, its respective switch electrode and its respective connector means ar integrally constructed of conductive material disposed on a flat, flexible film and wherein one or more of said separable connector pads and underlying film are flexibly adapted to be turned over.

3. The switch system of claim 1 in which said conductors are similarly disposed on both sides of a flat, flexible film and wherein at least a portion of said connector means on one side of said film is adapted to be turned over.

4. The switch system of claim 1 in which said film is a single, continuous film and said conductive material forming said conductor, said switch electrode and said connector means is a paint.

5. The switch system of claim 1 in which said conductors and their respective switch electrodes and connector means are integrally constructed of a conductive material disposed on a flat, flexible, dielectric film and in which a first, flexible, dielectric layer is disposed over at least a portion of said conductors, and wherein is further included a second layer of conductors and switch electrodes disposed on said dielectric layer, respective connector means connected to each second layer conductor, a second switch connector means disposed to electrically connect selected switch electrodes of said second layer together when said switch connector means and said switch electrodes are pressed together, said second layer of conductors and their respective switch electrodes and connector means being integrally constructed of a conductive material.

6. The combination recited in claim 1 wherein said other electrical circuitry comprises a printed circuit board having electrical circuits thereon.

7. The combination recited in claim 6, wherein said conductors, including the connector formed by said conductors, and the switch electrodes formed by said conductors are integrally formed of an electrically-conductive paint, deposited on said film.

8. The combination recited in claim 1 wherein said other electrical circuitry and electrical component comprise a printed circuit board which is a computer keyboard circuit board, said board comprising circuit means disposed to be actuated by the keys of a computer keyboard, and said circuit means on said circuit board comprises one or more of solder pads, printed circuit conductive areas and electronic packages, whereby said switch system is disposed to actuate one or more circuit means actuated by said keys of a computer.

9. An extension electrical switch system for connecting to electrical contacts, said switch system comprising a plurality of conductors, each of said conductors comprising a thin layer of an electrically-conductive paint disposed on a flexible, resilient film, each said conductor adapted at one location to provide a flexible connector for connecting to one of said electrical contacts, the conductors of said connectors adapted to be resiliently urged against said electrical contacts by the resilience of said flexible film and each said conductor being adapted at another location to provide an electrode of a switch, and switch connection means for electrically connecting together at least two electrodes of a pair of said conductors.

10. The combination recited in claim 9, wherein at least some of said conductors, at the location said conductors form said flexible connectors, are separable from the other of said conductors forming flexible connectors.

11. The combination recited in claim 9, wherein said film with said conductors thereon is adaptable to form a connector for an electronic package having a plurality of electrical leads on opposite sides, and the resilience of said film urges said conductors against said electrical leads on both sides of said electronic package.

12. An extension electrical switch system for connecting to a plurality of electrical contacts, said system comprising a plurality of electrical conductors painted on a flexible, resilient film, said conductors forming, at or near one end, switch electrodes, and, at or near the other end, flexible, electrical connector means, said connector means portion of said conductors adapted to be placed in contact with said electrical contacts and wherein at least one portion of said connector means is separable from another portion of said connector means.

13. The combination recited in claim 12, in which said conductors are similarly disposed on both sides of said film and wherein at least a portion of said connector means on one side of said film is adapted to be turned over.

14. The combination recited in claim 12, wherein said film is adapted to be disposed so that the resilience of said film urges the connector portions of said electrical conductors against said plurality of electrical contacts.

15. The method of manufacturing an extension electrical switch system for connecting to at least one of an electrical circuit or an electrical component, comprising forming at least one pair of elongated, electrical conductors on a flexible, dielectric film, said conductors forming at one location at least a pair of switch electrodes, providing switch connector means disposed to electrically connect at least a pair of said switch electrodes together when said switch connector means and said switch electrodes are pressed into contact with each other, and at another location, forming said conductors into flexible connector means comprised of connector pads, at least some of which connector pads and their underlying film are separable from the other of said connector pads and their underlying film and thus adapted for making separate electrical connections to said electrical circuitry or said electrical component.

16. The method recited in claim 15, in which each said conductor, connector, and switch electrode is a continuous paint disposed on a single sheet of film.

17. The method recited in claim 15, wherein said film is elongated and wherein said connector means is formed to comprise said plurality of electrical connection pads at or near one end of said film, and said switch means is formed at or near the other end of said film and said electrical conductors are formed on said film between said connectors and said switch electrodes and wherein said connection pads, said switch electrodes, and said conductors are all formed of substantially the same conductive paint adhered to the same film.

18. The method of forming an extension electrical switch system for connecting to at least one of an electrical circuit or an electrical component, comprising forming at least one pair of elongated, electrical conductors, forming said electrical conductors into a pair of switch electrodes at one location, forming switch connector means disposed to electrically connect at least a pair of said switch electrodes together when said switch connector means and said switch electrodes are pressed into contact with each other, and forming, at another location along said electrical conductors, electrical connector means for connecting to said other electrical circuit or said electrical component, said connector means comprising said conductors formed on a flexible, resilient film and wherein said film is adapted to resiliently urge said connector means against said electrical circuitry or said electrical component.

19. The method recited in claim 18 wherein at least a portion of said electrical connector means is formed to be separable from another portion and one of said portions is adapted to be turned over.

20. The method recited in claim 18 wherein said film is adapted to resiliently urge said connector means against the electrical leads on opposite sides of an electrical component having leads on opposite sides.

21. The method recited in claim 18 in which said conductors and its switch electrodes and connector means are similarly formed on both sides of said film and wherein at least a portion of said connector means on one side of said film is adapted to be turned over.

* * * * *